United States Patent [19]

Chiu et al.

[11] 4,125,650

[45] Nov. 14, 1978

[54] RESIST IMAGE HARDENING PROCESS

[75] Inventors: George T. Chiu, Wappingers Falls; Edward C. Fredericks, Hopewell Junction, both of N.Y.

[73] Assignee: International Business Machines Corporation, Armonk, N.Y.

[21] Appl. No.: 822,468

[22] Filed: Aug. 8, 1977

[51] Int. Cl.$^2$ .............................................. B05D 3/06
[52] U.S. Cl. ................................ 427/337; 96/35.1; 96/36.2; 427/43; 427/372 R
[58] Field of Search ............ 427/43, 273, 337, 372 R; 96/35.1, 36.2, 91 N

[56] References Cited

U.S. PATENT DOCUMENTS

| | | | |
|---|---|---|---|
| 3,278,305 | 10/1966 | Laridon et al. | 96/115 R |
| 3,459,708 | 8/1969 | Stevens | 260/59 |
| 3,502,470 | 3/1970 | Delzenne et al. | 96/35.1 |
| 3,660,097 | 5/1972 | Mainthia | 96/91 |
| 3,711,287 | 1/1973 | Dunham et al. | 96/115 R |
| 3,920,483 | 11/1975 | Johnson et al. | 148/1.5 |

OTHER PUBLICATIONS

IBM Tech. Disc. Bull., vol. 17, No. 11, 4-1976, p. 3270.
IBM Tech. Disc. Bull., vol. 18, No. 5, 10-1976, p. 1395.
Kammlott et al., "J. Electrochem. Soc.", vol. 121, No. 7, Jul. 1974, pp. 930-932.

*Primary Examiner*—John H. Newsome
*Attorney, Agent, or Firm*—David M. Bunnell

[57] ABSTRACT

Resist images are hardened so that they are flow resistant at elevated temperatures by coating the image with a layer of a quinone-diazide hardening agent and heating the image to cause the agent to react with the resist and form a hardened image.

16 Claims, No Drawings

RESIST IMAGE HARDENING PROCESS

BACKGROUND OF THE INVENTION

The formation of resist masks in the manufacture of integrated circuits using radiation sensitive layers which contain various organic polymers is known. Layers of the radiation sensitive material are formed on a substrate, exposed to light or other activating radiation such as electron beam or x-rays in a patternwise manner, and a visible image is developed by removing the more soluble portions of the layer with a developing solution. In order to improve the characteristics of the remaining portions of the resist layer, such as its adhesion to various substrates, or its resistance to chemical and/or thermal degradation, the patterned resist layer is conventionally baked at an elevated temperature. The thermoplastic polymer materials in the resist are subject to flow at temperatures above their second order glass transition temperature. This tendency to flow distorts the resist image pattern, and in the fine geometry patterns which are required, for example, in integrated circuit manufacture the distortion can result in dimensional changes or even the closing of fine lines. Such distortion can also take place where the resist image is heated during the processing of the substrate such as by hot etchant solutions, ion implantation or plasma etching. One solution to the problem has been the incorporation of free radical initiators into the resist structure such as is described in copending application Ser. No. 699,927 filed June 25, 1976. While this produces resist masks having improved chemical and thermal stability, it does have the effect of lowering the sensitivity of the resist materials to radiation resulting in a need for longer exposure times. U.S. Pat. No. 3,920,483 describes a resist hardening process prior to ion implantation in which the resist mask is subjected to an RF gas plasma oxidation to reduce the thickness of the photoresist layer and limit resist flow during the ion implantation step.

A process has now been found for hardening resist images which does not require any special equipment for the hardening process and which avoids the need to modify the resist composition prior to exposure.

BRIEF SUMMARY OF THE INVENTION

In accordance with the invention the method is provided for forming a flow resistant resist mask on a substrate comprising coating the mask with a solution of a hardening agent to form a layer of hardening agent on the resist mask. The mask is then heated to cause the agent to react with the exposed surfaces of the resist mask and form a hardened resist mask. The excess agent is then removed. The hardening agents are water soluble salts of orthoquinone diazide sulfonic and carboxylic acids.

DETAILED DESCRIPTION

The hardening agents for the practice of the invention are water soluble salts of orthoquinone diazide sulfonic and carboxylic acids. Such compounds include orthoquinone diazides of the benzene, naphthalene, and phenanthrene series. Some examples of such compounds have the formulae:

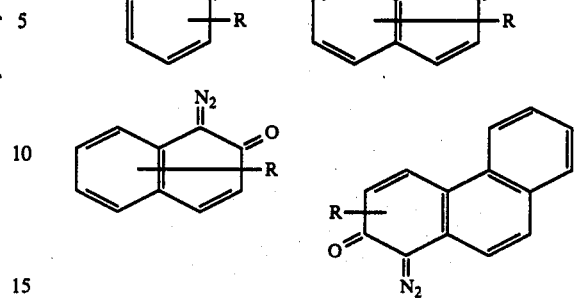

where R is $SO_3X$ or $COOX$ and X is, for example Na, K, Ca, Ba, Li or $NH_4$.

Examples of specific compounds would be:

sodium 2-diazo-1-oxobenzene-4-sulfonate;
sodium 1-diazo-2-oxonaphthalene-4-sulfonate
potassium 1-diazo-2-oxonaphthalene-4-carboxylate;
sodium-2-diazo-1-oxonaphthalene-5-sulfonate;
sodium 1,2-diazo-phenanthrole-(2)-X-sulfonate.

The coating solutions of hardening agents are prepared in concentrations of about 0.5 to 10% by weight of agent to the total weight of solution. Amounts of hardening agents below about 0.5% may not provide sufficient hardening to sufficiently limit resist flow on heating. There are no advantages in using amounts greater than 10% and the presence of such amounts can result in cratering or void formation in the resist mask pattern caused by the evolution of gas during the heating step. In fact, when unpatterned areas of resist layer larger than about 20 × 20 mils are present, the range of concentrations should be kept from about 0.5 to 1.5 percent to avoid cratering in these areas.

The solvent system or the hardeners is based on water so that attack of the resist layer by the coating solution is avoided. It has been found that better wetting of the resist layer by the coating solution, and consequently more uniform coating of hardening agent, is obtained if a mixture of water with alcohols having 2 to 4 carbon atoms such as ethanol, propanol and butanol is used. The portions of water and alcohol are such that sufficient solubility of the hardening agent is obtained while attack by the solvent on the resist system is avoided. In place of or in addition to the use of alcohols to improve wetting, surfactants can be added with amounts ranging from about 0.01 to 1% being satisfactory. Examples of suitable surfactants are; sodium lauryl sulfate, fluorocarbon surfactants, sodium palmitates and polymethacrylic acid solution.

A layer of hardener is formed on the resist mask by conventional techniques such as dipping, spraying or spin coating to form a continuous layer over the resist mask and substrate. A thickness of about 400 Å is the minimum needed to assure a continuous coating of the top and side walls of the resist image and a preferred range is about 500 to 1,000 Å. The desired coating thickness can be achieved in the spin coating technique by varying the spin speed. The spin time is chosen to remove the bulk of the solvent by evaporation.

The resist compositions which are hardened by the technique of the invention can be either positive or negative acting resists. Negative resists are those which cross-link and become less soluble upon exposure to radiation. Examples of negative resists are sensitized polyvinyl cinnamate polymer compositions such as are described in U.S. Pat. No. 2,732,301 and sensitized partially cyclized poly-cis-isoprene polymer compositions such as are described in U.S. Pat. No. 2,852,379. Examples of positive resists which are degraded and become more soluble upon exposure to radiation are sensitized novolak resin compositions such as described for example in U.S. Pat. Nos. 3,046,118; 3,046,121; 3,201,239 and 3,666,743.

The resist layers are coated on a substrate and patternwise exposed to radiation after which the more soluble portions of the layer, which would be the exposed portions on a positive resist and the unexposed portions on a negative resist, are removed with a developer solution. The resulting patterned resist mask is then ready for treatment in accordance with the process of the invention by coating with a layer of orthoquinone diazide hardening agent. After coating, the resist mask is heated at a temperature sufficient to cause the orthoquinone diazide to react with the resist layer and form a cross-linked outer portion, particularly on the sides of the resist image, so that the lateral flow of the image is inhibited when the image is subjected to temperatures above the second order glass transition temperatures of the polymeric portion of the resist layer. The heating temperatures range from about 110° C. to about 210° C. in an inert atmosphere, for example, nitrogen. Oven baking is preferred because fewer craters occur in relatively large unpatterned areas when compared to baking on a hot plate. Baking times of 10 to about 30 minutes are sufficient to complete the hardening process.

After the baking step has been completed, the hardener residue which remains on the substrate around the edges of the resist mask is easily removed by a water rinse.

The resulting resist mask exhibits substantially no lateral flow of the images. The hardened resist image maintains its dimensional integrity during subsequent treatments of the exposed portions of the substrate such as etching with hot acids or with a reactive gas plasma, ion implantation, or metal evaporation which cause the resist layer to be heated to elevated temperatures.

The invention is further illustrated by, but is not intended to be limited to, the following examples wherein parts are parts by weight unless otherwise indicated.

EXAMPLE 1

A patterned positive resist mask was formed on the surface of a clean, metal coated, silicon semiconductor wafer. The resist composition was a mixture of a phenolformaldehyde novolak resin and the 2-diazo-1-oxo-napthalene-5-sulfonic acid ester of dihydroxybenzophenone. The resist was spin coated at 4000 rpm onto the metal surface to a dry thickness of about 2.2 microns, baked at about 85° C. for 20 minutes, patternwise exposed to actinic radiation and then developed with a aqueous alkaline developer solution to remove the exposed portions. The resist mask and wafer were spin coated at 3,000 rpm for 1 minute with a 1% by weight solution of sodium 2-diazo-1-oxo-napthalene-5-sulfonate in a 50/50 by volume mixture of water and isopropanol. The coating thickness was about 500 Å. The coated wafer was then baked in an oven in a nitrogen atmosphere for 20 minutes at a temperature of 210° C. ± 5° C. and then the hardener residue was removed by a 5 minute deionized water rinse. The hardener prevented the lateral flow of the resist images and dimensional changes were small ($\leq$ 20 microinches).

The exposed portions of the metal layer were then etched by placing the wafer in a reactive gas plasma. The resist mask erosion appeared to be uniform and the resist had a smooth surface following the metal etch. This permits a thinner resist mask to be used without resulting in attack of the underlying metal layer portions during the plasma etching process. In contrast, resist layers on control wafers which had only a normal postbake or which contained an added peroxide in the composition showed a rough, pitted surface after plasma etching.

The use of hardener concentrations of 2.5 to 5% in the process according to Example 1 resulted in normal hardening of the patterned areas but large, 20-50 mil, unpatterned areas showed craters apparently caused by the bursting of trapped gas bubbles which were generated during the heat hardening process. The use of a hardener concentration of 0.25%, while producing only small changes in image size did show a significant thinning of the narrow (about 100 micro inch) resist lines. The optimum hardener concentration, therefore, should be chosen to minimize flow while avoiding cratering in the particular pattern involved. Concentrations of 0.5 to 1.25% by weight gave good overall results for integrated circuit device patterns.

EXAMPLE 2

A patterned positive resist mask having a thickness of about 1.5 microns was formed on a silicon wafer having a surface coating of thermal oxide by the procedure described in Example 1. The resist mask was coated using a 10% solution of sodium 1-diazo-2-oxo-napthalene-4-sulfonate in deionized water. Approximately 4 to 6 milliliters of the solution which was filtered through a 0.5 micron filter was spun onto the resist images with a spin speed of 3,500 rpm for 60 seconds. The resulting hardener coating had a thickness of about 1,000 Å. The wafer was then baked in an oven in a nitrogen atmosphere at a temperature of 210° C. plus or minus 5° C. for 20 minutes. Microphotographs of the resist image show that resist image flow was substantially avoided. In contrast, resist images on control wafers which had not been subjected to the hardening treatment showed substantial flow after baking at 210° C. and resist images which were coated with peroxides such as Lupersol 101 or polymethacrylic acid solutions in deionized water and postbaked at 210° C. for 20 minutes were badly flowed and distorted.

EXAMPLE 3

In order to illustrate the use of the process with negative working resists, silicon semiconductor wafers having a surface coating of thermal oxide were coated with a resist film which was a partially cyclized poly-cis-isoprene polymer containing a sensitizer compound 2,6-bis-(p-azido-benzylidene)-4-methylcyclohexane by spin coating at 6,000 rpm and prebaked at 90° C. for 20 minutes and then exposed patternwise to ultraviolet light for 60 seconds. The exposed wafer was developed in a solvent for 4 minutes at room temperature to remove the unexposed portions and blown dry with nitrogen. The wafer was then broken into halves and one half was coated with sodium 2-diazo-1-oxo-naphthalene-5-sulfonate from a 4.3% by weight aqueous solution containing also 0.1% polymethacrylic acid. The other half was used as a control. Both halves of the wafer were baked in an oven in a nitrogen atmosphere at 180° C. for 30 minutes. The hardened resist image showed a significant improvement in preserving the image shape after baking. The resist image on the untreated half was badly flowed. Similar results were obtained when another wafer, half of which was treated and half of which was untreated, was baked at a temperature of 210° C. under a nitrogen atmosphere for 30 minutes.

The foregoing has described a resist mask hardening process which requires no special equipment or additives to the resist layer prior to the resist mask formation.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A process for forming a flow resistant organic polymeric resist mask on a substrate comprising coating the mask with a solution of a quinone diazide hardening agent to form a layer of hardening agent on the resist mask, heating the coated mask to cause the agent to react with the exposed surfaces of the mask and then removing the excess hardening agent.

2. The process of claim 1 wherein the hardening agent is a water soluble acid salt of an orthoquinone diazide.

3. The process of claim 2 wherein the hardening agent is a sulfonic acid salt of an orthoquinone diazide.

4. The process of claim 2 wherein the hardening agent is a carboxylic acid salt of an orthoquinone diazide.

5. The process of claim 1 wherein the solution comprises water.

6. The process of claim 5 wherein the solution includes an alcohol having 2 to 4 carbon atoms.

7. The process of claim 1 wherein the hardening agent concentration in the solution is from about 0.5 to 10 percent by weight of solution.

8. The process of claim 1 wherein the hardening agent concentration in the solution is from about 0.5 to 1.5 percent by weight of solution and the layer of hardening agent is from about 500 to 1000 Å in thickness.

9. The process of claim 2 wherein the hardening agent has the formula:

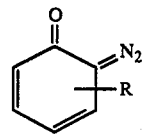

where R is SO$_3$X or COOX and X is Na, K, Ca, Ba, Li, or NH$_4$.

10. The process of claim 2 wherein the hardening agent has the formula:

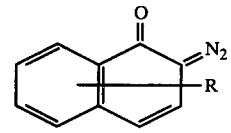

where R is SO$_3$X or COOX and X is Na, K, Ca, Ba, Li, or NH$_4$.

11. The process of claim 2 wherein the hardening agent has the formula:

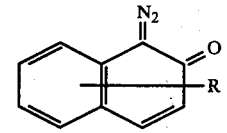

where R is SO$_3$X or COOX and X is Na, K, Ca, Ba, Li, or NH$_4$.

12. The process of claim 2 wherein the hardening agent has the formula:

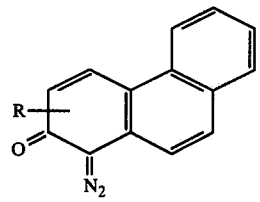

where R is SO$_3$X or COOX and X is Na, K, Ca, Ba, Li, or NH$_4$.

13. The process of claim 1 wherein the solution includes a wetting agent.

14. The process of claim 13 wherein the wetting agent is a surfactant present in an amount of about 0.01 to 1.0% by weight of solution.

15. The process of claim 1 wherein the resist mask is formed from a positive acting resist composition.

16. The process of claim 1 wherein the resist mask is formed from a negative acting resist composition.

* * * * *